(12) United States Patent
Jiang et al.

(10) Patent No.: US 11,353,495 B2
(45) Date of Patent: Jun. 7, 2022

(54) FABRICATION VARIATION ANALYSIS METHOD OF SILICON MACH-ZEHNDER ELECTRO- OPTIC MODULATOR

(71) Applicant: Nanjing University, Jiangsu (CN)

(72) Inventors: Wei Jiang, Jiangsu (CN); Zhaobang Zeng, Jiangsu (CN); Peiyan Zhao, Jiangsu (CN)

(73) Assignee: Nanjing University, Jiangsu (CN)

( * ) Notice: Subject to any disclaimer, the term of this patent is extended or adjusted under 35 U.S.C. 154(b) by 64 days.

(21) Appl. No.: 16/879,278

(22) Filed: May 20, 2020

(65) Prior Publication Data
US 2020/0371153 A1 Nov. 26, 2020

(30) Foreign Application Priority Data

May 20, 2019 (CN) .......................... 201910418266.0

(51) Int. Cl.
*G01R 31/26* (2020.01)
*G02F 1/225* (2006.01)
(Continued)

(52) U.S. Cl.
CPC ....... *G01R 31/2637* (2013.01); *G02F 1/2257* (2013.01); *H04B 10/07953* (2013.01); *G02F 1/212* (2021.01); *G02F 2202/105* (2013.01)

(58) Field of Classification Search
CPC ... G01R 31/2637; G02F 1/212; G02F 1/2257; G02F 2202/105; H04B 10/07953
(Continued)

(56) References Cited

U.S. PATENT DOCUMENTS 8,463,838 B1 * 6/2013 Ulhorn ...................... G06E 3/00
708/816
8,655,116 B2 * 2/2014 Ishimura ............... G02F 1/2255
385/2
(Continued)

OTHER PUBLICATIONS

Zhao et al; Correlation between driving signal reflection on electrodes and performance variation of silicon Mach-Zehnder modulators; Nov. 2019; Optical Society of America; pp. 1-13. (Year: 2019).*

(Continued)

*Primary Examiner* — Amritbir K Sandhu
(74) *Attorney, Agent, or Firm* — Muncy, Geissler, Olds & Lowe, P.C.

(57) ABSTRACT

The invention discloses a fabrication process variation analysis method of a silicon-based Mach-Zehnder electro-optic modulator. The method includes the following steps: (1) use the input reflection coefficient $S_{11}$ to characterize and quantify the reflection deviation characteristics of the driving signal on the traveling wave electrode; (2) measure and quantify the modulated signal characteristics of the silicon Mach-Zehnder electro-optic modulator. The modulated signal characteristics include transmission characteristics, vertical direction characteristics and horizontal direction characteristics; (3) Pearson correlation coefficient and partial correlation coefficient are introduced. By analyzing the value and variation trend of Pearson correlation coefficient and partial correlation coefficient, the relationship between the deviation of the driving signal reflection and the deviation of the modulated signal characteristics is analyzed. The method of the present invention can establish the relationship between fabrication process control and performance analysis at the device level, and help to develop device designs with better fabrication tolerances.

7 Claims, 3 Drawing Sheets

(51) Int. Cl.
*H04B 10/079* (2013.01)
*G02F 1/21* (2006.01)

(58) Field of Classification Search
USPC .......................................................... 702/83
See application file for complete search history.

(56) References Cited

U.S. PATENT DOCUMENTS

| | | | | |
|---|---|---|---|---|
| 8,818,141 | B1* | 8/2014 | Hochberg | G02F 1/225 |
| | | | | 385/3 |
| 9,923,631 | B1* | 3/2018 | Moilanen | H04B 17/00 |
| 10,263,704 | B2* | 4/2019 | Cheng | H04B 10/25759 |
| 2006/0008194 | A1* | 1/2006 | Kagaya | G02F 1/0121 |
| | | | | 385/1 |
| 2013/0321491 | A1* | 12/2013 | Heishi | G09G 5/10 |
| | | | | 345/690 |
| 2017/0207543 | A1* | 7/2017 | Kirino | G01S 13/347 |

OTHER PUBLICATIONS

Zeng et al; Variation of Signal Reflection on Electrodes of Silicon Mach-Zehnder Modulators: Influence of Nanoscale Variation and Mitigation Strategies; 2021; Nanomaterials; pp. 1-15. (Year: 2021).*

Zeng et al; variation of signal reflection on Electrodes of Silicon Mach-Zehnder modulators: Influence of Nanoscale variation and mitigation strategies; Feb. 2021; MDPI nanomaterials journal; pp. 1-15. (Year: 2021).*

Zhao et al; Correlation between driving signal reflection on electrodes and performance variation of silicon Mach-Zehnder modulators; Nov. 2019; Optics Express; pp. 1-13 (Year: 2019).*

* cited by examiner

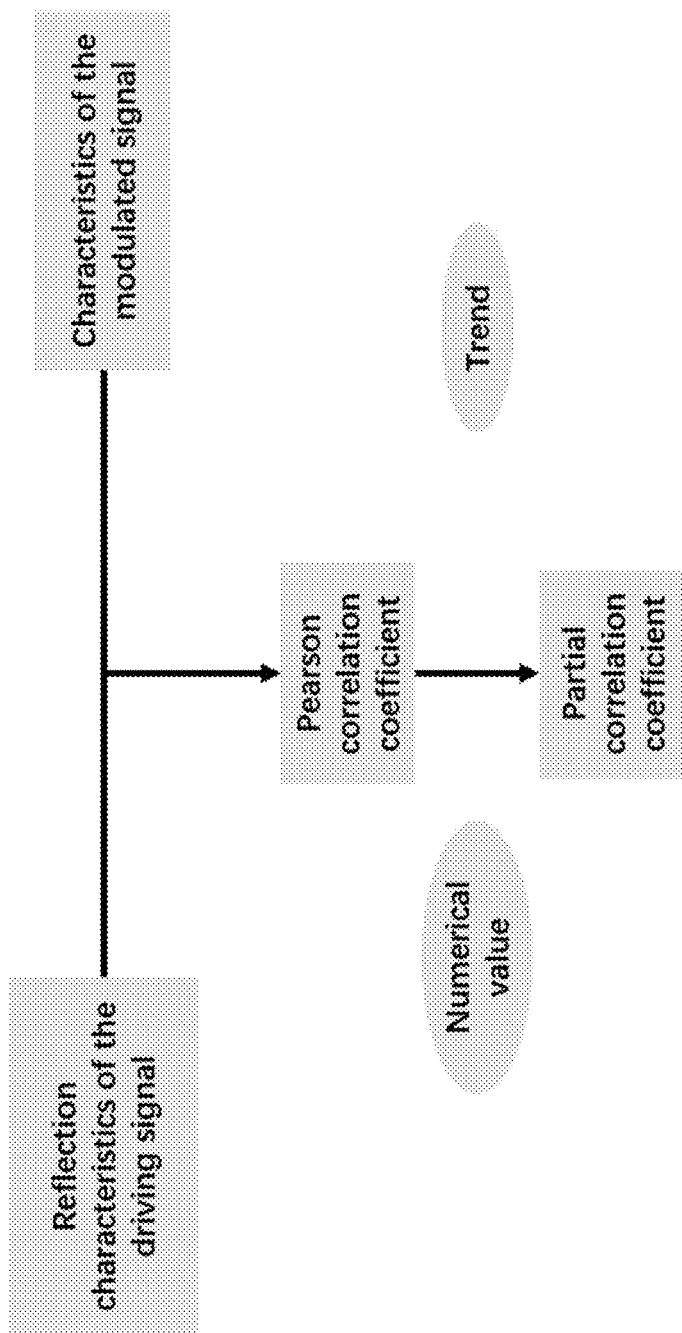

FABRICATION VARIATION ANALYSIS METHOD OF SILICON MACH-ZEHNDER ELECTRO- OPTIC MODULATOR

TECHNICAL FIELD

The present invention relates to an analysis method applied to a silicon mach-zehnder electro-optical modulator to realize the fabrication variation analysis at the device level.

TECHNICAL BACKGROUND

Silicon photonics is compatible with the traditional CMOS technology, and it has shown great potential in the next generation of high-speed data transmission. Various passive and active devices have been demonstrated, such as couplers, splitters, switches, modulators, and photodetectors. And among these devices, silicon modulators constitute a key building block in silicon photonics considering its broad applications in short-reach optical interconnects for data centers and supercomputers. At present, Mach-Zehnder modulator (MZM) structures are often preferred owing to their broad optical bandwidth, high thermal stability and robust fabrication tolerance.

Fabrication variation is an important issue that needs to be solved in practical application of silicon-based photonics. Several studies have paid attention to the effect of the fabrication variation. But Most of these studies are limited to passive devices, such as ring resonators and directional couplers. For the fabrication variation in passive devices, the current research usually analyzes from the structural level, that is, characterizes the device, and analyzes the influence of the structure size, surface morphology and other factors on the device performance.

The silicon Mach-Zehnder electro-optic modulator is one of the most important active devices, which has a more complicated structure than passive devices. If the fabrication variation analysis is carried out from the structural level like a passive device, it usually requires a lot of manpower, material and financial resources. Therefore, people rarely perform fabrication variation analysis on silicon Mach-Zehnder electro-optic modulators.

SUMMARY OF THE INVENTION

The present invention provides a device-level fabrication variation analysis method for silicon Mach-Zehnder electro-optic modulators, which is to analyze the device performance deviation caused by the reflection deviation of the driving signal on the traveling wave electrode.

The technical scheme adopted by the present invention is as follows:

A fabrication variation analysis method of silicon Mach-Zehnder electro-optic modulator includes the following steps:

(1) In a silicon Mach-Zehnder electro-optic modulator, the driving signal is loaded on the traveling wave electrode structure, and the input reflection coefficient $S_{11}$ of the traveling wave electrode is measured; the arithmetic average and weighting of the coefficient $S_{11}$ are calculated within a certain frequency range The average number to quantify the reflection characteristics of the driving signal on the traveling wave electrode;

(2) Measure and quantify the modulated signal characteristics of the silicon Mach-Zehnder electro-optic modulator. The modulated signal characteristics include transmission characteristics, vertical direction characteristics, and horizontal direction characteristics;

(3) Introduce Pearson correlation coefficient, analyze the relationship between the deviation of driving signal reflection and the deviation of modulated signal characteristic by analyzing Pearson correlation coefficient value and change trend;

(4) Introduce partial correlation coefficients, and further analyze the relationship between the deviation of driving signal reflection and the deviation of modulated signal characteristic by analyzing the value and trend of partial correlation coefficient.

In step (2), the transmission characteristics are quantified using bit error rate; the vertical direction characteristics are quantified using modulation amplitude, signal-to-noise ratio and extinction ratio; the horizontal direction characteristics are using RMS jitter, peak-to-peak jitter, rise time, and fall time are quantified, where RMS jitter and peak-to-peak jitter represent signal timing fluctuations, and rise time and fall time represent signal transitions.

The specific process of step (2) is: using a laser to emit a suitable wavelength and input it into a silicon Mach-Zehnder electro-optic modulator through a polarization controller to make it work at an orthogonal point; Enter the photodetector directly, or enter the photodetector after being amplified and filtered by the amplifier; use the bit error rate tester to transmit the driving signal, and directly load it onto the silicon Mach-Zehnder modulator for modulation in an appropriate manner, or After being amplified and biased by the power amplifier and biaser, it is loaded onto the silicon Mach-Zehnder modulator for modulation in an appropriate manner; the modulated signal is connected to the bit error rate tester to obtain the bit error rate; The modulated signal is connected to the oscilloscope to obtain the parameters values of modulation amplitude, signal-to-noise ratio, extinction ratio, RMS jitter, peak-to-peak jitter, rise time and fall time.

In the above step (3), the Pearson between the deviation characteristic of the driving signal reflection and the deviation characteristic of each evaluation parameter of the modulated signal are calculated in the two modes of the arithmetic average and weighted average of the coefficient $S_{11}$ under different spectrum ranges Correlation coefficient.

In step (4), the partial correlation between the deviation characteristics of the driving signal reflection and the deviation characteristics of each evaluation parameter of the modulated signal is calculated in the two modes of the arithmetic average and weighted average of the coefficient $S_{11}$ under different frequency ranges coefficient.

Compared with the existing technology, the present invention has the following advantages:

The reflection deviation of the driving signal on the traveling wave electrode is one of the most common fabrication variation problems in the silicon Mach-Zehnder modulator, and it is difficult to get the corresponding conclusion by analyzing the fabrication variation at the structure level. The present invention can avoid the structural level by analyzing the relationship between the deviation of driving signal reflection and the deviation of modulated signal characteristic, that is, performing fabrication variation analysis from the device level, and can save a lot of manpower, material resources, and financial resources. The method of the present invention can establish the relationship between fabrication process control and performance analysis at the device level, and help to develop device designs with better fabrication-process tolerances.

DESCRIPTION OF THE FIGURES

FIG. 4. is a flow diagram of calculation and analysis of correlation coefficients.

SPECIFIC IMPLEMENTATION METHOD

Figure 1:
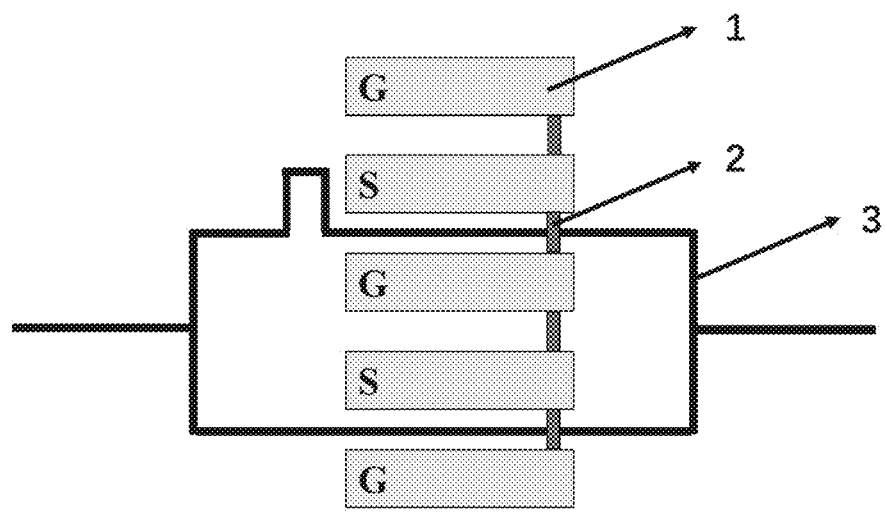
FIG. 1. is a schematic structural view of a silicon Mach-Zehnder electro-optical modulator according to an embodiment of the present invention, wherein 1—traveling wave electrode, 2—matching resistance, 3—optical waveguide.

The following examples are provided for a better understanding of the present invention and are not limited to the best mode. There is no specific test or analysis steps are indicated in the examples, just follow the routine test or analysis procedures described in the literature in the silicon modulator field. The instruments or equipment used in the experiment are all conventional instruments or equipment that can be purchased from the market.

The invention provides a fabrication variation analysis method of a silicon Mach-Zehnder electro-optic modulator. The specific analysis steps are as follows:

1. Quantify the Reflection Characteristics of the Driving Signal on the Traveling Wave Electrode Using a vector network analyzer, the $S_{11}$ response characteristic of the upstream wave electrode of the silicon Mach-Zehnder electro-optic modulator can be measured, but the $S_{11}$ response characteristic is a frequency-dependent quantity, and the overall reflection characteristic of the driving signal on the traveling wave electrode cannot be obtained.

The arithmetic average of the $S_{11}$ response can be used to quickly and intuitively quantify the reflection characteristics of the driving signal on the traveling wave electrode. The specific formula is as follows $$R = \frac{x_1 + x_2 + \ldots x_m}{m}$$

Where R is the reflectivity of the driving signal on the traveling wave electrode in the required frequency range; $x_1$, $x_2$, . . . , $x_m$ are the specific data points in the required frequency range; m is the number of data points in the required frequency range.

The weighted average of the $S_{11}$ response can be used to more accurately quantify the reflection characteristics of the driving signal on the traveling wave electrode. The specific formula is as follows $$R = \frac{x_1 n_1 + x_2 n_2 + \ldots x_m n_m}{n_1 + n_2 \ldots + n_m}$$

Where R is the reflectivity of the driving signal on the traveling wave electrode in the required frequency range; $x_1$, $x_2$, . . . , $x_m$ are the specific data points in the required frequency range; $n_1$, $n_2$, . . . , $n_m$ are the required The weighting factor of each specific data point in the frequency range; m is the number of data points in the required frequency range.

2. Quantify Modulated Signal Characteristics

Using the bit error rate tester and oscilloscope, the modulated signal characteristics of the silicon Mach-Zehnder electro-optic modulator can be measured. Here, the modulated signal characteristics are quantified from three aspects of transmission characteristics, vertical direction characteristics and horizontal direction characteristics.

For the transmission characteristics, this embodiment uses the bit error rate to quantify. The bit error rate can intuitively quantify the transmission characteristics of the modulated signal. In the analysis, the bit error rate takes the logarithmic value.

For the vertical direction characteristic, this embodiment uses the modulation amplitude, signal-to-noise ratio and extinction ratio to quantify. The signal-to-noise ratio is the ratio of signal strength to noise strength in the modulated signal, and the extinction ratio is the ratio of the strength of the two modulation states of the modulated signal. In the analysis, the signal-to-noise ratio and extinction ratio are dB values.

For the horizontal direction characteristics, this embodiment uses RMS jitter, peak-to-peak jitter, rise time, and fall time to quantify. Root-mean-square jitter and peak-to-peak jitter represent the timing fluctuations of the signal, and the rise time and fall time represent the transition process of the signal.

3. Introduce the Pearson correlation coefficient, and analyze the relationship between the driving signal reflection and the modulated signal characteristics by analyzing the value and change trend of the Pearson correlation coefficient.

The calculation formula of Pearson correlation coefficient is as follows $$\rho_{X,Y} = \frac{\text{cov}(X, Y)}{\sigma_X \sigma_Y}$$

Where X is the reflection characteristic of a driving signal on a traveling wave electrode in different silicon Mach-Zehnder electro-optic modulators, and Y is a certain evaluation parameter quantifying modulated signal characteristics in different silicon Mach-Zehnder electro-optic modulators; cov (X, Y) refers to the covariance between reflection characteristics and modulated signal characteristics, $\sigma_X$ is the standard deviation of reflection characteristics, $\sigma_Y$ is the standard deviation of modulated signal characteristics, $\rho_{X,Y}$ is It is the Pearson correlation coefficient between the reflection characteristic X and the modulated signal characteristic Y.

When $\rho_{X,Y}$ is between 0.8 and 1, X and Y are strongly correlated; when $\rho_{X,Y}$ is between 0.6 and 0.8, X and Y are strongly correlated; when $\rho_{X,Y}$ Between 0.4 and 0.6, X and Y are moderately correlated; when $\rho_{X,Y}$ is between 0.2 and 0.4, X and Y are weakly correlated; when $\rho_{X,Y}$ is between 0 and 0.2, X and Y are very weakly correlated or uncorrelated.

By changing the average frequency range and the modulated signal characteristic parameters, the Pearson correlation coefficient between the reflection deviation characteristics of the driving signal and the modulated signal characteristics quantified by different evaluation parameters in different frequency ranges can be obtained. The value of Pearson correlation coefficient provides a reference for the trade-off of various parameters in the design, and the change trend provides a reference for the trade-off of the working frequency in the design.

4. Introduce partial correlation coefficient, analyze the relationship between the driving signal reflection and modulated signal characteristics by analyzing the values and trends of the partial correlation coefficients.

The calculation formula of the first-order partial correlation coefficient is as follows:

$$\rho_{XY_1 \cdot Y_2} = \frac{\rho_{XY_1} - \rho_{XY_2}\rho_{Y_1Y_2}}{\sqrt{(1-\rho_{XY_2}^2)(1-\rho_{Y_1Y_2}^2)}}$$

Where X is the reflection characteristic of the driving signal on a traveling frequency electrode in different silicon Mach-Zehnder electro-optic modulators, and $Y_1$ and $Y_2$ are evaluation parameters quantifying modulated signal characteristics in different silicon Mach-Zehnder-type electro-optic modulators; $\rho_{XY_1}$ is the Pearson correlation coefficient between the reflection characteristic X and the modulated signal characteristic $Y_1$; $\rho_{XY_1}$ is the Pearson correlation coefficient between the reflection characteristic X and the modulated signal characteristic $Y_2$; $\rho_{Y_1Y_2}$ is the Pearson correlation coefficient between the modulated signal characteristic $Y_1$ and the modulated signal characteristic $Y_2$; $\rho_{Y_1Y_2}$ is the reflection characteristic X and the modulated signal characteristic $Y_1$ after removing the influence of the modulated signal characteristic $Y_2$ Partial correlation coefficient. $Y_2$ is not limited to the characteristics of the modulated signal, but can also be other characteristic parameters of the modulator.

By changing the average frequency range and the modulated signal characteristic parameters, the partial correlation coefficient between the reflection deviation characteristics of the driving signal and the modulated signal characteristics quantified by different evaluation parameters in different frequency ranges can be obtained. The numerical value of the partial correlation coefficient provides a reference for the trade-offs of various parameters in the design, and the change trend provides a reference for the trade-offs of the working frequency in the design.

Implementation Case

In this embodiment, the silicon Mach-Zehnder electro-optic modulators electro-optic modulators to be tested are all located on the same wafer and have the same design, as shown in FIG. 1. The test of the modulator is carried out under the drive of a single arm, the modulation rate is 25 Gb/s, and the operating frequency of the test system is 0-40 GHz.

Figure 2:
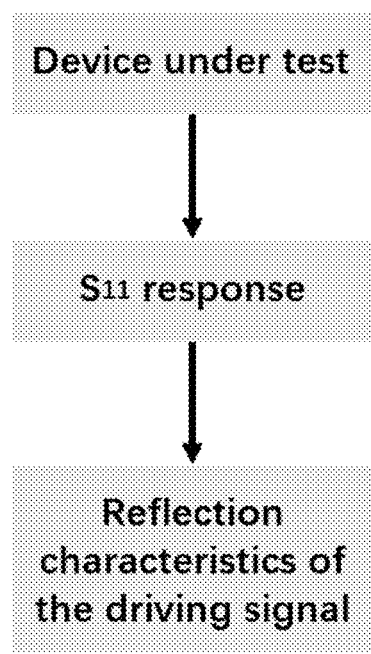
FIG. 2. is a flow diagram of the quantification of the reflection characteristics of the driving signal on the traveling-wave-electrode.

Step 1. To quantify the reflection characteristics of the driving signal on the traveling wave electrode. The test flow diagram is shown in FIG. 2.

With the help of vector network analyzers, cables and GSG probes, $S_{11}$ response tests were performed on several silicon Mach-Zehnder electro-optic modulators. Among them, the frequency range is 0.1-40 GHz, with a total of 400 data points. The packaged devices can also be tested directly using cables or leads or other appropriate methods or tools without using probes.

Due to fabrication variation, there will be a mismatch in the transmission line impedance and terminal matching resistance on the traveling wave electrode. Depending on the degree of mismatch, the $S_{11}$ response spectrum will also vary. At this time, further processing is required to quantify the reflection characteristics of the driving signal on the traveling wave electrode.

The reflection characteristics of the driving signal on the traveling wave electrode can be quickly and intuitively quantified by arithmetic average. According to the target modulation rate of 25 Gb/s, from 0.1-12.5 GHz, a frequency range is taken every 0.5 GHz until the maximum bandwidth of the test system is 0.1-40 GHz. In this way, the reflection characteristics of the driving signal on the traveling wave electrode are quickly and intuitively quantified in 55 frequency ranges.

The reflection characteristic of the driving signal on the traveling wave electrode can be more accurately quantified by the weighted average. According to the target modulation rate of 25 Gb/s, the frequency spectrum of the driving signal is tested with the aid of a spectrum analyzer and cable. Among them, the frequency range is 0.1-40 GHz, with a total of 400 data points, which is the same as the $S_{11}$ response. The intensity of each frequency in this spectrogram will be used as a weighting factor for weighted average processing. Similar to the arithmetic average, according to the target modulation rate of 25 Gb/s, starting from 0.1-12.5 GHz, a frequency range is taken every 0.5 GHz until the maximum bandwidth of the test system is 0.1-40 GHz. In this way, the reflection characteristics of the driving signal on the traveling wave electrode are more accurately quantified in the 55 frequency ranges.

Figure 3:
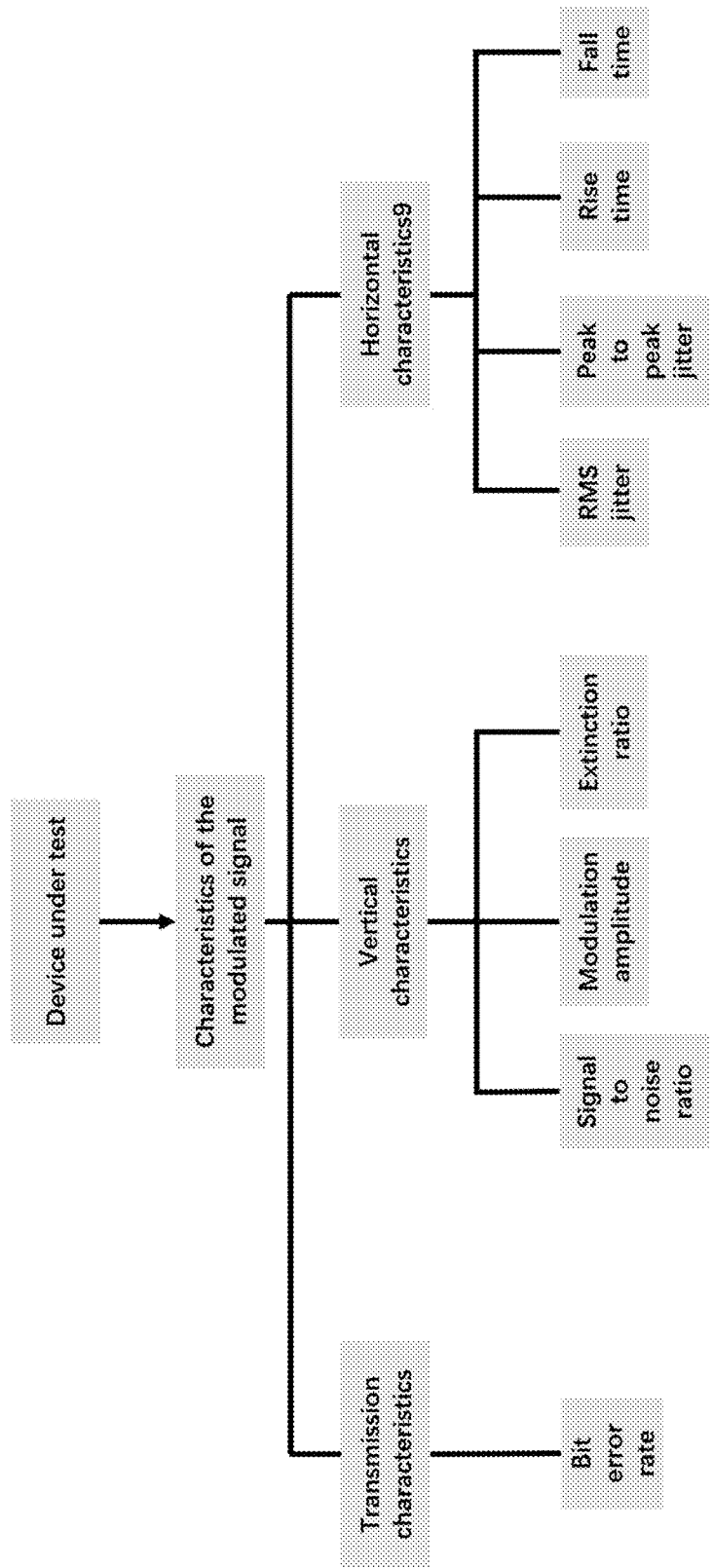
FIG. 3. is a flow diagram of quantification of modulated signal characteristics.

Step 2. Quantify modulated signal characteristics. The test flow diagram is shown in FIG. 3.

A tunable laser is used as the input for the silicon Mach-Zehnder electro-optic modulator with a proper wavelength through a polarization controller to make it work at the quadrature point. The output optical signal is amplified through an EDFA and the amplified spontaneous emission (ASE) noise is filtered by a tunable optical filter. Finally, the signal is fed into a commercial photodetector. The bit error rate tester transmits the driving signal, which is amplified and biased by the power amplifier and the biaser, and then loaded onto the single arm of several silicon Mach-Zehnder modulators through GSG probes or cable interfaces or leads modulation.

Connect the modulated signal to the bit error rate tester to obtain the transmission characteristic of the modulated signal whose bit error rate; connect the modulated signal to the oscilloscope to obtain the vertical direction characteristics and modulation characteristics of the modulated amplitude, signal-to-noise ratio and extinction ratio. Root-mean-square jitter, peak-to-peak jitter, rise time, fall time of these modulated signals in the horizontal direction.

Step 3. The Pearson correlation coefficient is introduced to calculate the Pearson correlation coefficient between the reflection characteristics of the driving signal and the performance parameters of the modulated signal in different average frequency ranges under the two conditions of arithmetic average and weighted average respectively.

In this embodiment, in the case of the arithmetic average and the weighted average, the deviation characteristics of the driving signal reflection deviation and the modulated signal bit error rate are calculated in the average frequency range from 0.1-12.5 GHz to 0.1-40 GHz Pearson correlation coefficient.

It can be seen from the results that in the arithmetic average case, under different average frequency ranges, the correlation coefficient between the driving signal reflection and the bit error rate is higher, and the correlation coefficient in a specific average frequency range can reach the extreme value, the trend of change It is related to the reflection characteristics; in the weighted average case, the correlation coefficients are similar in size, and the change trend tends to be stable, which is related to the low reflection weight at high frequencies.

The reason for the high correlation coefficient is that for the reflected propagation signal on the electrode caused by the reflection of the driving signal, it will cause the fluctuation of the overall driving signal on the traveling wave electrode, thereby causing the fluctuation of the level of the optical modulated signal, and the bit error rate is largely represented by the vertical signal level.

By analyzing the value and change trend of Pearson's correlation coefficient, the signal characteristics of signal-to-noise ratio and extinction ratio are quantified in the vertical direction, and the RMS jitter, peak-to-peak jitter, rise time and fall time are quantified in the horizontal direction to drive the signal reflection. There is a large difference in size and change of correlation coefficient between the driving signal reflection and them.

Step 4. The partial correlation coefficient is introduced to calculate the partial correlation coefficient between the reflection characteristic of the driving signal and the deviation characteristic of each evaluation parameter of the modulated signal in different average frequency ranges under the two cases of S11 arithmetic mean and S11 weighted mean respectively.

In this embodiment, in the two modes of arithmetic average and weighted average, in these average frequency ranges of 0.1-12.5 GHz to 0.1-40 GHz, calculated Partial correlation coefficient between the deviation characteristics of the driving signal's reflection deviation and the modulated signal's BER.

Performance parameters such as bit error rate, signal-to-noise ratio, and extinction ratio are related to the modulation amplitude. In order to truly reflect the correlation coefficient between the driving signal reflection and the performance parameters, the influence of the modulation amplitude, which is the evaluation parameter of the modulated signal, needs to be excluded. We chose to calculate the first-order partial correlation coefficient between the driving signal reflection characteristic and performance parameters. RMS jitter, PP jitter, rise time, and fall time, which are parameters that quantify the signal characteristics in the horizontal direction, they are affected by other evaluation parameters which is more complicated. To truly reflect the correlation between the driving signals and them, the higher order partial correlation coefficient can be calculated to exclude the influence of more evaluation parameters Through the analysis of Pearson correlation coefficient and partial correlation coefficient, it is possible to establish a device-level connection between fabrication process control and performance analysis, which helps to develop device designs with better fabrication-process tolerance.

The analysis method of the present invention is also applicable to other modulation rate and other frequency test systems. The analysis method of the present invention is also applicable to the dual-driving situation of a silicon Mach-Zehnder electro-optic modulator.

We claim:

1. A fabrication variation analysis method for a silicon Mach-Zehnder electro-optic modulator, characterized in that it includes following steps:
   (1) In the silicon Mach-Zehnder electro-optic modulator, a driving signal is loaded on a traveling wave electrode structure, and an input reflection coefficient $S_{11}$ of the traveling wave electrode is measured; calculate arithmetic average and weighted average of the input reflection coefficient $S_{11}$ within a certain frequency range to quantify reflection characteristics of the driving signal on the traveling wave electrode;
   (2) Measure and quantify the modulated signal characteristics of the silicon Mach-Zehnder electro-optic modulator, and the modulated signal characteristics include transmission characteristics, vertical direction characteristics, and horizontal direction characteristics;
   (3) Introduce Pearson correlation coefficient, analyze the relationship between deviation of driving signal reflection and deviation of modulated signal characteristic deviation by analyzing value and variation trend of the Pearson correlation coefficient;
   (4) Introduce partial correlation coefficient, further analyze relationship between the deviation of driving signal reflection and the deviation of modulated signal characteristic deviation by analyzing the value and variation trend of the partial correlation coefficient.

2. The fabrication variation analysis method for the silicon Mach-Zehnder electro-optic modulator according to claim 1, wherein in step (2), the transmission characteristics are quantified by bit error rate; vertical direction characteristics are quantified by modulation amplitude, signal-to-noise ratio, and extinction ratio; horizontal direction characteristics are quantified by root-mean-square (RMS) jitter, peak-to-peak (PP) jitter, rise time, and fall time, where the RMS jitter and the PP jitter represent timing fluctuation of signal, and the rise time and the fall time represent transition process of the signal.

3. The fabrication variation analysis method for the silicon Mach-Zehnder electro-optic modulator according to claim 2, wherein the specific process of step (2) is: using a laser to emit laser light of a suitable wavelength; after passing through polarization controller, it is input into the silicon Mach-Zehnder electro-optic modulator, which works at a quadrature point; the optical signal output from the silicon Mach-Zehnder electro-optic modulator directly enters photodetector, or enters the photodetector after being amplified by amplifier and subsequently filtered; the driving signal is transmitted by bit error rate tester, which is directly loaded onto the silicon Mach-Zehnder modulator for modulation, or loaded onto the silicon Mach-Zehnder modulator in an appropriate way after amplification and bias processing by power amplifier and biasing device; connect the modulated signal to the bit error rate tester to obtain the bit error rate; connect the modulated signal to an oscilloscope to obtain the modulation amplitude, signal-to-noise ratio, and extinction ratio, RMS jitter, PP jitter, rise time and fall time.

4. The fabrication variation analysis method for the silicon Mach-Zehnder electro-optic modulator according to claim 2, wherein in step (3), under the two modes of arithmetic average and the weighted average of coefficient $S_{11}$, respectively, the Pearson correlation coefficient between the deviation of reflection characteristics of the driving signal and each evaluation parameter of the modulated signal is calculated under different frequency ranges.

5. The fabrication variation analysis method of a silicon Mach-Zehnder electro-optic modulator according to claim 1, wherein in step (4), under the two modes of the arithmetic average and the weighted average of coefficient $S_{11}$, respectively, the partial correlation coefficient between the reflection deviation characteristics of the driving signal and the deviation characteristics of each evaluation parameter of the modulated signal under different frequency spectrum ranges is calculated.

6. The fabrication variation analysis method of the silicon Mach-Zehnder electro-optic modulator according to claim 1, wherein in step (3), the Pearson correlation coefficient calculation formula is as follows:

$$\rho_{X,Y} = \frac{\text{cov}(X, Y)}{\sigma_x \sigma_y}$$

where X is the reflection characteristic of a driving signal on the traveling wave electrode in the different silicon Mach-Zehnder electro-optic modulators, and Y is a certain evaluation parameter quantifying modulated signal characteristics in different silicon Mach-Zehnder electro-optic modulators; cov(X, Y) refers to the covariance between the reflection characteristic X and the modulated signal characteristic Y, $\sigma_X$ is the standard deviation of the reflection characteristic X, $\sigma_Y$ is the standard deviation of the modulated signal characteristic Y, $\rho_{X,Y}$ is the Pearson correlation coefficient between the reflection characteristic X and the modulated signal characteristic Y.

7. The fabrication variation analysis method for the silicon Mach-Zehnder electro-optic modulator according to claim 1, where in step (4), the calculation formula of the first-order partial correlation coefficient is as follows:

$$\rho_{XY_1 \cdot Y_2} = \frac{\rho_{XY_1} - \rho_{XY_2}\rho_{Y_1 Y_2}}{\sqrt{(1 - \rho_{XY_2}^2)(1 - \rho_{Y_1 Y_2}^2)}}$$

where X is the reflection characteristic of the driving signal on a traveling frequency electrode in different silicon Mach-Zehnder electro-optic modulators, and $Y_1$ and $Y_2$ are two different evaluation parameters of the modulated signal characteristics of the different silicon Mach-Zehnder electro-optic modulators, in addition $Y_2$ can also be other characteristic parameters of the modulator; $\rho_{X,Y_1}$ is the Pearson correlation coefficient between the reflection characteristic X and the modulated signal characteristic $Y_1$; $\rho_{X,Y_1}$ is between the reflection characteristic X and the modulated signal characteristic $Y_2$ Pearson correlation coefficient; $\rho_{Y_1 Y_2}$ is the Pearson correlation coefficient between the modulated signal characteristic $Y_1$ and the modulated signal characteristic $Y_2$; $\rho_{Y_1 Y_2}$ is the partial correlation coefficient between the reflection characteristic X and the modulated signal characteristic $Y_1$ after removing the influence of the modulated signal characteristic $Y_2$.

\* \* \* \* \*